United States Patent
Khang et al.

(10) Patent No.: US 7,504,280 B2
(45) Date of Patent: Mar. 17, 2009

(54) NONVOLATILE MEMORY DEVICE AND METHOD OF MANUFACTURING THE SAME

(75) Inventors: Yoon-ho Khang, Yongin-si (KR); Kyo-yeol Lee, Yongin-si (KR); Eun-hye Lee, Seoul (KR); Joo-hyun Lee, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 178 days.

(21) Appl. No.: 11/357,221

(22) Filed: Feb. 21, 2006

(65) Prior Publication Data
US 2006/0212976 A1    Sep. 21, 2006

(30) Foreign Application Priority Data
Feb. 21, 2005    (KR) .................. 10-2005-0014088

(51) Int. Cl.
*H01L 51/40* (2006.01)
(52) U.S. Cl. .................. 438/99; 438/211; 438/594; 438/962; 257/E21.007; 257/E21.179; 257/E21.68
(58) Field of Classification Search .............. 438/602, 438/603, 962; 257/E21.007, E21.179, E21.18, 257/E21.299
See application file for complete search history.

(56) References Cited

U.S. PATENT DOCUMENTS

| | | | | |
|---|---|---|---|---|
| 6,303,516 | B1 * | 10/2001 | Morita et al. | ............... 438/758 |
| 6,750,471 | B2 | 6/2004 | Bethune et al. | |
| 2003/0011036 | A1 * | 1/2003 | Bethune et al. | ............. 257/410 |

OTHER PUBLICATIONS

Korean Office Action dated Jun. 30, 2006 (with English translation).

* cited by examiner

*Primary Examiner*—Walter L Lindsay, Jr.
*Assistant Examiner*—Cheung Lee
(74) *Attorney, Agent, or Firm*—Buchanan Ingersoll & Rooney PC

(57) ABSTRACT

Provided is a nonvolatile memory device and a method of manufacturing the same. The nonvolatile memory device includes a semiconductor substrate on which a source, a drain, and a channel region are formed, a tunneling oxide film formed on the channel region, a floating gate formed of a fullerene material on the tunneling oxide, a blocking oxide film formed on the floating gate, and a gate electrode formed on the blocking oxide film.

6 Claims, 5 Drawing Sheets

NONVOLATILE MEMORY DEVICE AND METHOD OF MANUFACTURING THE SAME

CROSS-REFERENCE TO RELATED PATENT APPLICATION

This application claims the benefit of Korean Patent Application No. 10-2005-0014088, filed on Feb. 21, 2005, in the Korean Intellectual Property Office, the disclosure of which is incorporated herein in its entirety by reference.

BACKGROUND OF THE INVENTION

1. Field of the Invention

The present invention relates to a nonvolatile memory device and a method of manufacturing the same, and more particularly, to a nonvolatile memory device having an increased trap site density and a method of manufacturing the same.

2. Description of the Related Art

A unit memory cell of semiconductor memory devices, such as DRAM, may include one transistor and one capacitor. Therefore, to increase the integration density of a semiconductor memory device, the volume of the transistor and/or the capacitor must be reduced.

In the case of early memory devices when the integration density was not a big issue, photography and etching processes could be performed with sufficient process margins. Therefore, the integration density of semiconductor memory devices could be increased by reducing the volume of each element of the semiconductor memory device.

However, new methods are required as the demand for semiconductor memory devices having high integration density increases.

The integration density of a semiconductor memory device is closely related to a design rule. Therefore, to increase the integration density, a strict design rule must be applied. In this case, the process margins of photography and etching processes can be significantly reduced, meaning that these processes must be performed more precisely.

When the process margins of the photography and etching processes are reduced, the yield can also be reduced. Therefore, a method to increase the integration density of semiconductor memory devices without reducing the yield is needed.

To meet these requirements, many semiconductor memory devices having different structures from the conventional semiconductor memory devices have been introduced. These include a data storage medium that can store charge on the upper side of the channel of a transistor and has a different data storing function from a conventional capacitor.

A SONOS memory device is another newly introduced semiconductor memory device. FIG. 1 is a cross-sectional view illustrating a conventional memory device.

Referring to FIG. 1, a source region 12 and a drain region 14 to which an n type conductive dopant is implanted on a p type semiconductor substrate 10 (hereinafter, semiconductor substrate) are formed. A channel region 16 is formed between the source 12 and the drain 14. Also, a gate stack 18 is formed on the channel region 16 of the semiconductor substrate 10. The gate stack 18 is composed of a tunneling oxide film 18a, a nitride film $Si_3N_4$ 18b, a blocking oxide film 18c, and a gate electrode 18d. Here, the nitride film 18b has trap sites. Therefore, when a voltage is applied to the gate electrode 18d, electrons pass through the tunneling oxide film 18a and are trapped in the trap site of the nitride film 18b. The blocking oxide film 18c blocks the migration of electrons to the gate electrode 18d while the electrons are trapped.

In this conventional semiconductor memory device, binary scale information can be stored and read using the characteristic that the threshold voltage varies depending on whether electrons are trapped in the trap site of the nitride film 18b.

Here, when the density of a trap site increases, more electrons can be trapped, and the variation of the threshold voltage can be increased. That is, the density of the trap site can significantly affect the characteristics of the memory device. Conventionally, to increase the density of a trap site, techniques of scattering or depositing nano scale particles, such as Si nanoparticles, on the surface of a thin film have been developed. However, these methods can only provide limited increases in the density of the trap site per unit area. These methods have various technical problems, especially in the uniformity of particle size and particle distribution, to be applied to a flash memory.

SUMMARY OF THE INVENTION

The present invention provides a nonvolatile memory device having an increased trap site density, and a method of manufacturing the same.

The present invention also provides a nonvolatile memory device comprising: a semiconductor substrate on which a source, a drain, and a channel region are formed; a tunneling oxide film formed on the channel region; a floating gate formed of a fullerene material on the tunneling oxide; a blocking oxide film formed on the floating gate; and a gate electrode formed on the blocking oxide film.

According to an aspect of the present invention, there is provided a method of manufacturing a nonvolatile memory device, comprising: preparing a semiconductor substrate on which a source, a drain, and a channel region are formed; forming a tunneling oxide film on the channel region; forming a floating gate on the tunneling oxide using a fullerene material; forming a blocking oxide film on the floating gate; and forming a gate electrode on the blocking oxide film.

According to the present invention, a nonvolatile memory device having an increased trap site density can be obtained. Therefore, the signal processing speed and capacity of the memory device can be increased since multi-bit data can be stored in a unit cell.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
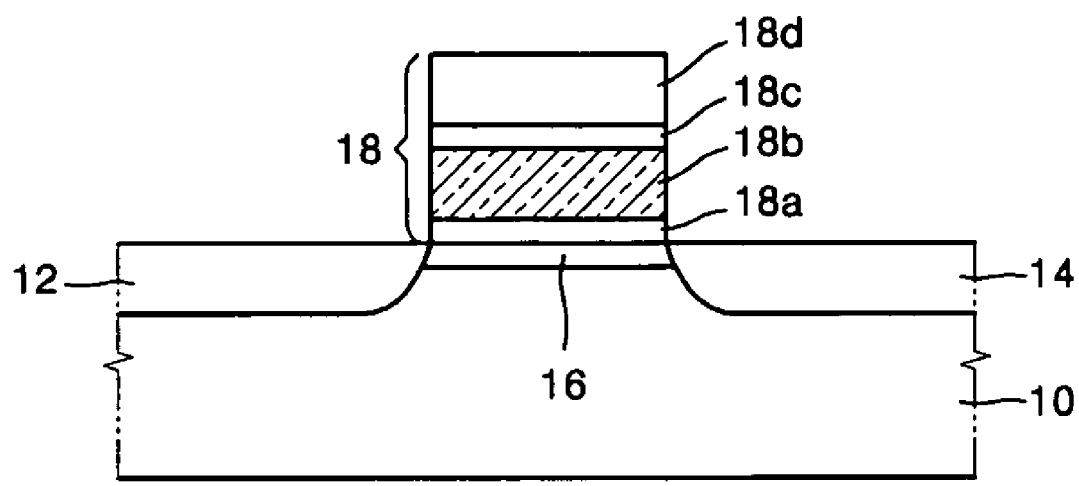
FIG. 1 is a cross-sectional view illustrating a conventional SONOS memory device.

The present invention will now be described more fully with reference to the accompanying drawings, in which exemplary embodiments of the invention are shown. In the drawings, the thicknesses of layers and regions are exaggerated for clarity.

Figure 2:
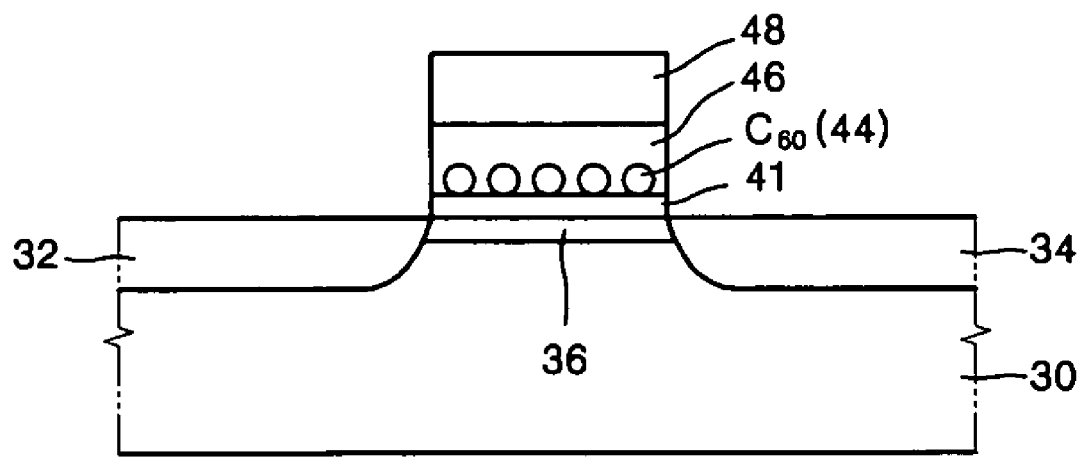
FIG. 2 is a cross-sectional view illustrating a nonvolatile memory device according to an embodiment of the present invention.

FIG. 2 is a cross-sectional view illustrating a nonvolatile memory device according to an embodiment of the present invention.

Referring to FIG. 2, a nonvolatile memory device according to the present invention comprises a substrate 30 on which a source 32, a drain 34, and a channel region 36 are formed, and a tunneling oxide film 41, a floating gate 44 formed of a fullerene material, a blocking oxide film 46, and a gate electrode 48, sequentially stacked on the channel region 36. Here, the detailed descriptions of the tunneling oxide film 41, the blocking oxide film 46, and the gate electrode 48 are omitted, since the functions and compositions of these elements are well known in the art. For example, the tunneling oxide film is formed of $SiO_2$. Also, the tunneling oxide film 41 can be formed of a material having a higher dielectric constant than the silicon oxide, such as $Al_2O_3$ or $ZrO_2$.

The source 32 and drain 34 regions are formed on the substrate 30 by implanting a conductive dopant in the substrate 30, and the channel region 36 is formed between the source and the drain regions 32 and 34.

An aspect of the present invention is that the floating gate 44 is formed of a fullerene material, such as fullerene nano-particles. Examples of the fullerene material are $C_{60}$, $C_{70}$, $C_{76}$, $C_{78}$, $C_{84}$, and carbon nanotubes. Also, the fullerene material can be an endohedral metallofullerene material which includes a metal atom. Here, the metal atom may be selected from the lanthanide metal group that includes La, Er, Gd, and Nd. Here, a detailed description of the fullerene materials is omitted since these are well known in the art. For example, a $C_{60}$ fullerene molecule is composed of 60 carbon atoms and looks like a football since it includes a pentagon and a hexagon formed by combining carbon. As is well known, the $C_{60}$ fullerene molecule has the characteristics of absorbing light and electrons.

The fullerene material has trap sites and the floating gate 44 formed of a fullerene material can trap more electrons than a floating gate formed of a conventional Si-nitride or Si nanocrystals, since the fullerene material, such as $C_{60}$, has a very small diameter of approximately 0.7 nm. Accordingly, the memory effect of a nonvolatile memory can be improved since the floating gate 44 formed of a fullerene material has increased trap efficiency. In particular, when the floating gate 44 is formed of C60 fullerene nano-particles having a diameter of 0.7 nm, the characteristics of a memory device can be maintained with a size reduction of the memory device, thereby maintaining the reliability of the memory device.

The blocking oxide film 46 blocks the migration of trapped electrons into the gate electrode 48 while electrons are trapped in the trap site. The blocking oxide film 46 is conventionally formed of $SiO_2$, but the present invention is not limited thereto and can use other oxides. For example, the blocking oxide film 46 can be formed of a material having a higher dielectric constant than the silicon oxide $SiO_2$, such as $Al_2O_3$ or $ZrO_2$.

In a nonvolatile memory device having the above structure, when a voltage is applied to the gate electrode 48, electrons enter the tunneling oxide film 41 and are trapped in the floating gate 44 formed of a fullerene material. The blocking oxide film 46 blocks the migration of trapped electrons into the gate electrode 48 while electrons are trapped in the trap site. Therefore, the nonvolatile memory device according to the present invention can store and read binary information using the characteristic that the threshold voltage varies depending on whether electrons are trapped in the floating gate 44.

The conventional technique of forming a floating gate by scattering or depositing Si nanocrystals on the surface of a tunneling oxide film to increase the density of a trap site can only give limited improvements. However, according to the present invention, a nonvolatile memory device having a higher trap site density than in the prior art can be obtained by replacing the material for forming the floating gate 44 with a fullerene material. Accordingly, in a nonvolatile memory device having the above structure, the signal processing speed is increased, and high capacity memory devices can be manufactured since multi-bit data can be stored in a unit cell. Also, the memory effect of the nonvolatile memory device is increased, and the manufacture of high integration memory devices is possible since the volume of the memory device can be reduced.

FIGS. 3A through 3E are cross-sectional views illustrating a method of manufacturing a nonvolatile memory device according to an embodiment of the present invention. In the present invention, each of the thin films can be formed using a well known method, such as chemical vapor deposition (CVD) or physical vapor deposition (PVD) method.

Figure 3A:
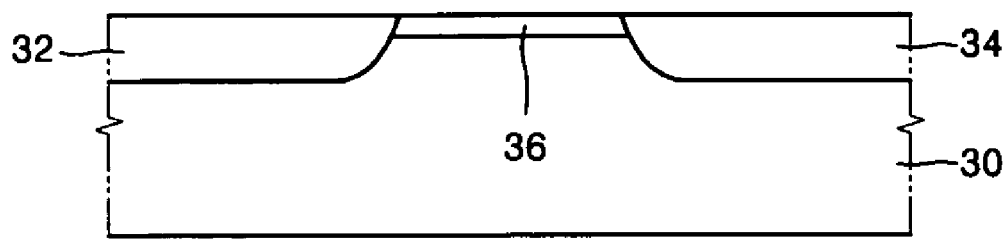
FIGS. 3A through 3F are cross-sectional views illustrating a method of manufacturing a nonvolatile memory device according to an embodiment of the present invention.
Figure 3B:
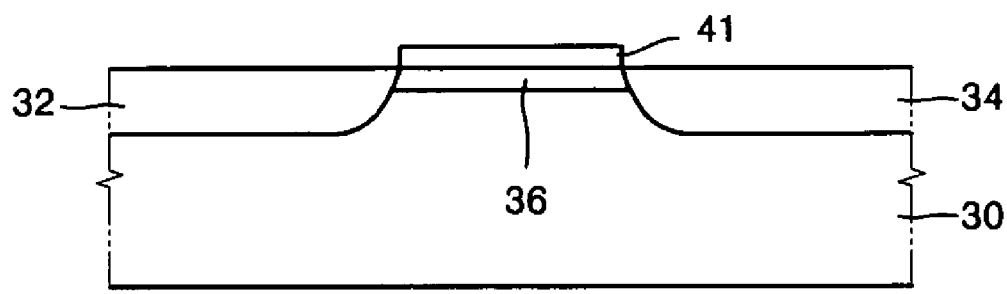

Referring to FIGS. 3A and 3B, a semiconductor substrate 30 is prepared on which a source 32, a drain 34, and a channel region 36 are formed. The source and the drain regions 32 and 34 can be formed by implanting a conductive dopant into the substrate 30, and the channel region 36 is formed between the source and the drain regions 32 and 34. Next, a tunneling oxide film 41 is formed on the channel region 36. The tunneling oxide film 41 is conventionally formed of $SiO_2$, but the present invention is not limited thereto and can use other oxides. For example, the tunneling oxide film 41 can be formed of a material such as $Al_2O_3$ or $ZrO_2$, having a higher dielectric constant than the silicon oxide $SiO_2$.

Figure 3C:
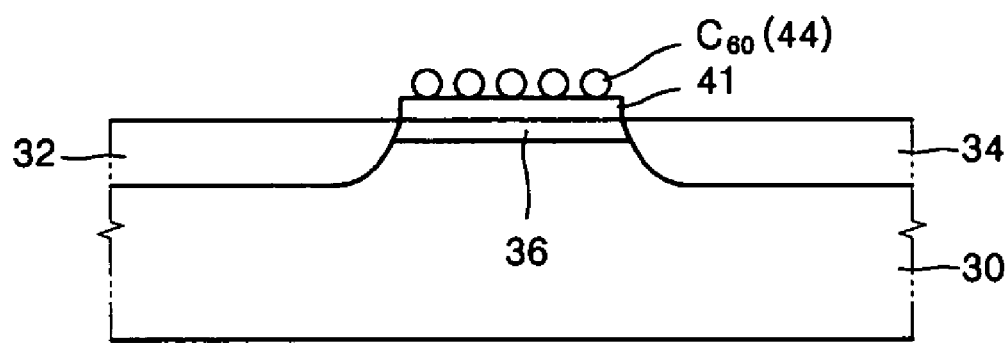

Referring to FIG. 3C, a floating gate 44 formed of a fullerene material, such as $C_{60}$ fullerene nano-particles, is formed on the tunneling oxide film 41. Here, examples of the fullerene material are $C_{60}$, $C_{70}$, $C_{76}$, $C_{78}$, $C_{84}$, and carbon nanotubes. The fullerene material can be endohedral metallofullerene which includes a metal atom. Here, the metal atom may be selected from the lanthanide metal group that includes La, Er, Gd, and Nd. Here, a detailed description of the fullerene materials is omitted since these are well known in the art.

To form a floating gate 44, a fullerene material is heated to 300-600° C. Then, the fullerene material evaporates into an aerosol-state, and a floating gate 44 having a controlled thickness can be obtained by depositing the aerosol-state fullerene material on the tunneling oxide film 41. More specifically, after heat treating the aerosol-state fullerene material at a temperature range of 200-1200° C. under a gas atmosphere which includes at least one gas selected from the group consisting of Ar, $N_2$, $O_2$, and $NH_3$, the heat treated aerosol-state fullerene material is deposited on the tunneling oxide film 41. For example, the heat treatment can be performed by passing the aerosol-state fullerene material through a heat treatment tube using a gas that includes a gas selected from the group consisting of Ar, $N_2$, $O_2$, and $NH_3$ as a carrier gas. Here, the temperature of the heat treatment tube must be maintained in the range of 200-1200° C.

Through the heat treatment, the trap site density of the floating gate 44 formed of fullerene nano-particles can be increased.

Figure 3D:
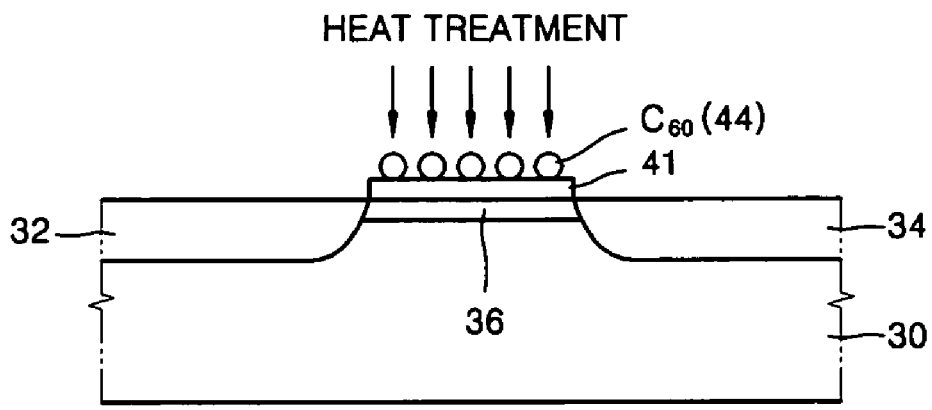

Referring to FIG. 3D, a blocking oxide film 46 is formed on the floating gate 44. The blocking oxide film 46 blocks the migration of trapped electrons into the gate electrode 48 while electrons are trapped in the trap site. The blocking oxide film 46 is conventionally formed of $SiO_2$, but the present invention is not limited thereto and can use other oxides. The blocking oxide film 46 can be formed of a material having a higher dielectric constant than the silicon oxide $SiO_2$, such as $Al_2O_3$ or $ZrO_2$.

Figure 3E:
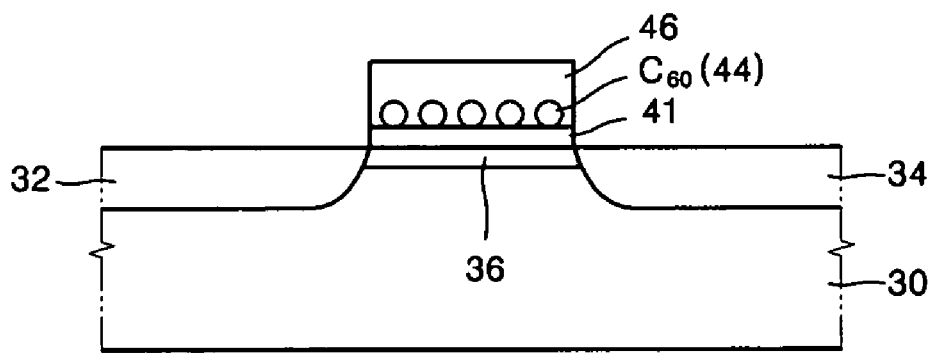
Figure 3F:
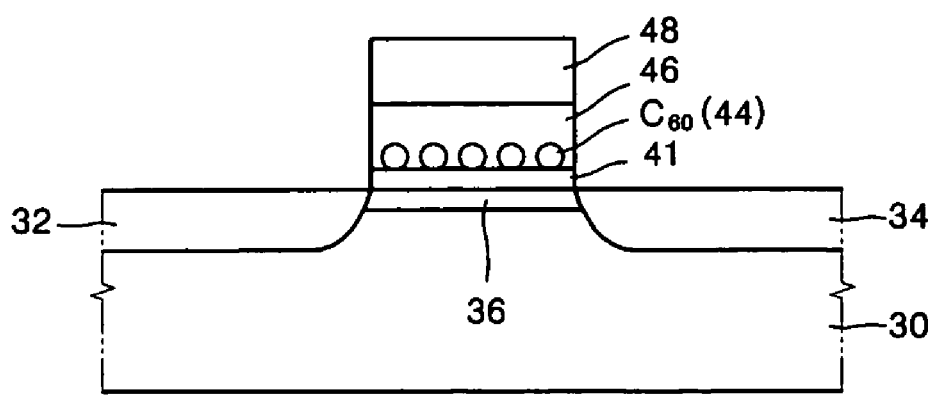

Referring to FIG. 3E, a gate electrode 48 is formed on the blocking oxide film 46. The gate electrode 48, as is well known in the art, is formed of a conductive material such as aluminum Al. Accordingly, a nonvolatile memory device having increased trap site density can be obtained through the above processes.

Figure 4:
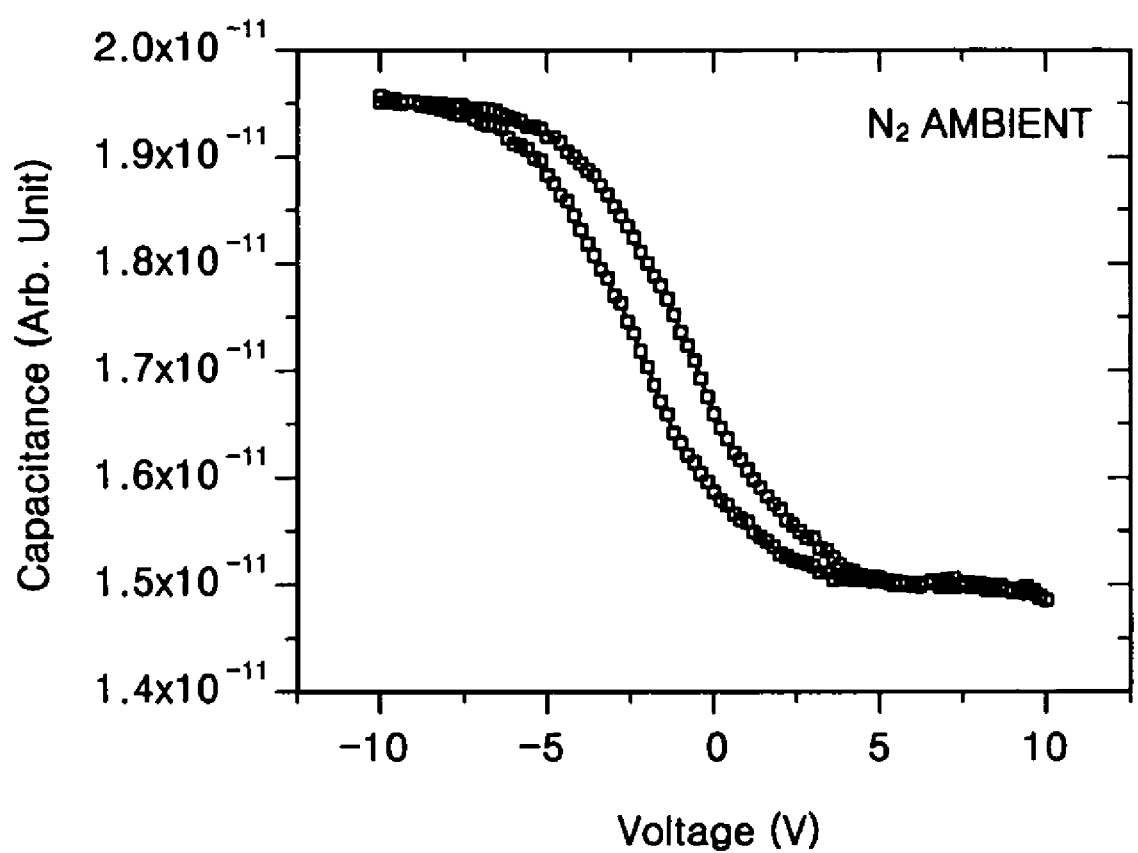
FIGS. 4 through 6 are graphs showing the capacitance-voltage (C-V) characteristics of a nonvolatile memory device according to the present invention.
Figure 5:
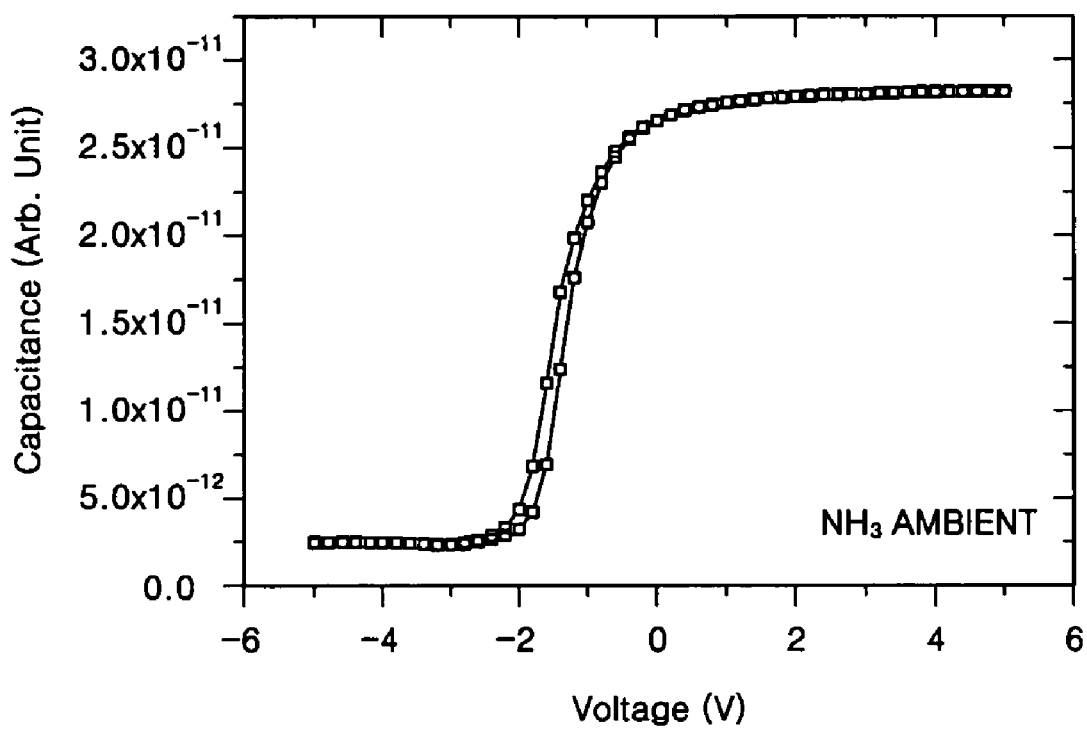
Figure 6:
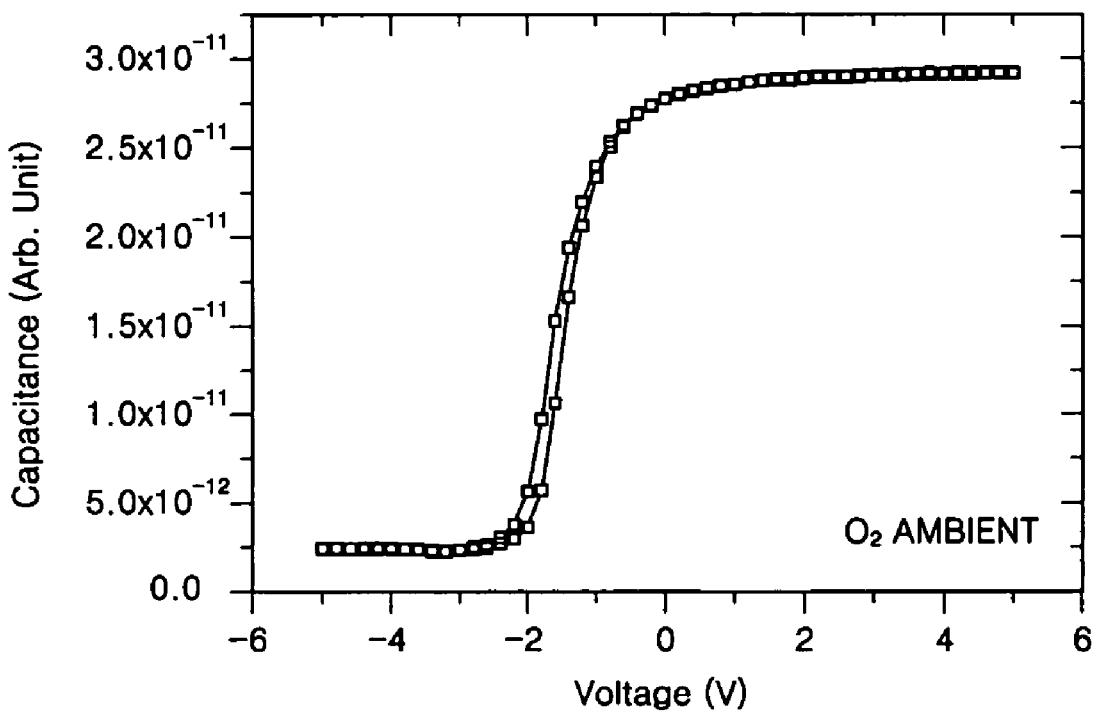

FIGS. 4 through 6 are graphs showing the capacitance-voltage (C-V) characteristics of a nonvolatile memory device according to the present invention. FIGS. 4 through 6 are comparisons of the C-V characteristics of nonvolatile memory devices using a floating gate formed by heat treating aerosol-state $C_{60}$ fullerene under $N_2$, $NH_3$, and $O_2$ atmospheres, respectively. When the graphs in FIGS. 4 through 6 are compared, the aerosol-state $C_{60}$ fullerene heat treated under an $N_2$ atmosphere shows the best trap site density.

According to the present invention, a nonvolatile memory device having increased trap site density can be obtained, showing a large variation of threshold voltage when electrons are trapped in the trap site. Therefore, the signal processing speed and capacity of the memory device can be increased since multi-bit data can be stored in a unit cell.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a nonvolatile memory device, comprising:
   preparing a semiconductor substrate on which a source, a drain, and a channel region are formed;
   forming a tunneling oxide film on the channel region;
   after forming the tunneling oxide film, forming a floating gate on the tunneling oxide using a fullerene material, wherein forming the floating gate using a fullerene material includes:
   preparing a fullerene material,
   evaporating the fullerene material into an aerosol state, and
   depositing the aerosol-state fullerene material on the tunneling oxide film;
   after forming the floating gate, forming a blocking oxide film on the floating gate; and
   after forming the blocking oxide film, forming a gate electrode on the blocking oxide film.

2. The method of claim 1, wherein the fullerene material includes nano-particles of a material selected from the group consisting of $C_{60}$, $C_{70}$, $C_{76}$, $C_{78}$, $C_{84}$, and carbon nanotubes.

3. The method of claim 2, wherein the fullerene material is endohedral metallofullerene which includes a metal atom.

4. The method of claim 3, wherein the metal atom is at least one selected from the lanthanide metal group that includes La, Er, Gd, Ho, and Nd.

5. The method of claim 1, wherein depositing the aerosol-state fullerene material includes:
   heat treating the aerosol-state fullerene material; and
   depositing the heat treated aerosol-state fullerene material on the tunneling oxide film.

6. The method of claim 5, wherein the heat treatment is performed at 200-1200° C. under a gas atmosphere which includes at least one gas selected from the group consisting of Ar, $N_2$, $O_2$, and $NH_3$.

* * * * *